United States Patent [19]

Martin

[11] Patent Number: 5,369,279
[45] Date of Patent: Nov. 29, 1994

[54] CHROMATICALLY COMPENSATED PARTICLE-BEAM COLUMN

[76] Inventor: Frederick W. Martin, Colebrook Rd., North Stratford, N.H. 03590

[21] Appl. No.: 109,976

[22] Filed: Aug. 20, 1993

Related U.S. Application Data

[63] Continuation of Ser. No. 893,849, Jun. 4, 1992, abandoned.

[51] Int. Cl.$^5$ .............................................. H01J 3/26
[52] U.S. Cl. ........................ 250/396 R; 250/396 ML
[58] Field of Search ......... 250/396 R, 396 ML, 492.2, 250/492.21

[56] References Cited

U.S. PATENT DOCUMENTS

| | | | |
|---|---|---|---|
| 4,362,445 | 12/1982 | Riecke | 250/396 R |
| 4,555,666 | 11/1985 | Martin | 250/396 R |
| 4,590,379 | 5/1986 | Martin | 250/396 R |
| 4,684,808 | 8/1987 | Plies et al. | 250/396 R |

OTHER PUBLICATIONS

Harriott et al. "Archomatic quadrupole focusing system for use with liquid metal ion source" 1990 American Vacuum Society, pp. 1706–1710.

Kelman et al. "A quadrupole lens with negative chromatic aberration" Brief communication. pp. 271–272.

Primary Examiner—Paul M. Dziersynski
Assistant Examiner—Kiet T. Nguyen

[57] ABSTRACT

A particle-beam column comprising a needle-type ions source such as a liquid metal ion source, one or more round lenses, and a plurality of interleaved quadrupole lenses, by means of which the chromatic aberration of the column may be reduced or entirely compensated. Also an ion-beam column comprising a liquid alloy ion source, interleaved quadrupole lenses, and a Wien velocity filter, whereby a focused beam of ions of a single atomic number may be produced. Such columns produce a more finely focused beam than columns based only on electrostatic lenses, and allow increased lens apertures and larger beam currents.

7 Claims, 2 Drawing Sheets

CHROMATICALLY COMPENSATED PARTICLE-BEAM COLUMN

The U.S. government has a paid-up license in this invention and the right in limited circumstances to require the patent owner to license others on reasonable terms as provided by the terms of grant number ISI85 21 280 awarded by the National Science Foundation.

Continuation of application Ser. No. 07/893,849, filed Jun. 4, 1992, abandoned.

FIELD OF THE INVENTION

The invention pertains to the field of ion optics, as it is used in equipment for forming finely focused ion beams, used generally in such fields as microfabrication and microanalysis, such as ion implantation in semiconductors, micromachining of materials, ion beam lithography, and secondary ion microscopy.

BACKGROUND OF THE INVENTION

In the prior art, equipment used to make fine beams generally consists of a needle-type source of particles which may emit electrons or cause ionization of surrounding gas, involve surface ionization at low temperatures, or most commonly is a needle wet with a liquid metal or alloy containing a desired ion. In some cases a single lens is used to form an image of the very small emitting region of the source. Greater intensity is obtained by using a condensing lens near the source or a plurality of condensing lenses. When several lenses are used, it is possible to make an intermediate image of the source; and if the intermediate image is placed at the center of an ion-optical component such as an accelerating gap or a Wien filter, the aberrations caused by the component are greatly reduced. However the focusing ability of all systems utilizing electrostatic lenses is limited by the chromatic aberration of these lenses in combination with the unavoidable energy spread of ions emerging from the ion source. The full width d of the final focal spot is given by a formula of the type $$d = C\, a\, dE/E$$

where dE is the spread of energies about the central energy E of the ions, a is the full angle of convergence at the final focus, and C is a chromatic aberration coefficient. Chromatic aberration differs from other aberrations in its first-order dependence upon a. For example the spherical aberration of a round lens varies as $a^3$. Thus 1st-order chromatic aberration is important at small lens apertures, where spherical has become very small, and 3rd-order spherical aberration will dominate at some large value of a.

The insufficient focusing ability of electrostatic systems causes limitations to ion-optical devices which have been longstanding difficulties in the prior art. In applications such as micromachining, the current density is of prime importance. The current from a liquid metal ion source is given by $$I = B\, a_s b_s\, r^2$$

where typical numbers are brightness $B = 10^6$ A/sr-cm², emission angles $a_s$, $b_s = 400$ milliradians, and effective source radius smaller than $r = 100$ Angstroms. Because the effective source is so small, the size of the beam is given by d rather than by the geometrical image of the source. Accordingly the current density J is given by $$J = I/d^2 = B(ab/ab)(rE/C\, dE)^2.$$

Since the quantity E/C is roughly constant in electrostatic lenses it has been stated that "the maximum current density obtained of about 1 A/cm² will not be increased substantially in the near future." Even complicated electrostatic lenses containing four electrodes produce a maximum of 10 A/cm². To overcome this longstanding difficulty, an object of the present invention is to increase current density, by utilizing achromatic lenses in which C=0.

When covering a large specimen area is desired, such as in maskless ion implantation for fabrication of application-specific integrated circuits, the current rather than the current density becomes important. At 1 nA current, the time to write a 4-inch wafer at a dose of $10^{13}$ ions/cm² in a single-lens system is about an hour. The low current has been a difficulty in such equipment. Larger currents may be obtained in a system with a plurality of lenses, which allow operation with larger values of a and b. However such increased angles introduce aberrations which may make the focused beam larger than the desired feature size. For angles smaller than the knee angle at which chromatic and other aberrations are equal, removal of chromatic aberration will result in a larger operating angle and a larger current for any given focused beam size. Accordingly, an object of the present invention is to produce higher currents and allow microfabrication at higher writing speeds, by utilizing complete achromatic systems in which C=0.

BRIEF SUMMARY OF THE INVENTION

Ion beam columns comprising liquid metal ion sources and a plurality of electrostatic lenses cannot produce fine beams focused to a spot as small as the image of the ion source. Instead the spread of energies of ions emitted from the source produces a variation in focal length which blurs and enlarges the image. Chromatic aberration of this sort is a property of all electrostatic and solely magnetic lenses. A particle-beam column which eliminates this problem consists of the combination of a needle-type ion source, a plurality of electrostatic lenses, and a plurality of interleaved quadrupole lenses, which are 8-pole lenses having poles that are alternately electric and magnetic, so as to form interleaved electric and magnetic quadrupole lenses. By adjustment of the electric-to-magnetic ratio, the interleaved lenses may be made achromatic, whereby the chromatic aberration of the column is greatly reduced, or may be made to have negative chromatic aberration, whereby the chromatic aberration of the column is entirely eliminated.

A mass-separating ion-beam column which removes unwanted ions produced by a liquid alloy ion source, of use in the field of ion implantation, comprises such a column with a Wien velocity filter located after the ion source. Such a column can be short and uncurved, but also produce ions of a single atomic number in the final focus.

Elimination of chromatic aberration also allows larger apertures to be used within the lenses, so that a higher beam current is produced at a given focused beam spot size. Aperture size is then limited by higher-order aberrations, rather than 1st-order chromatic aberration.

DESCRIPTION OF THE DRAWINGS

FIGS. 3-7 are diagrams in which typical rays in the two principal sections of the optical system are shown.

DETAILED DESCRIPTION OF THE INVENTION

Figures 1, 2:
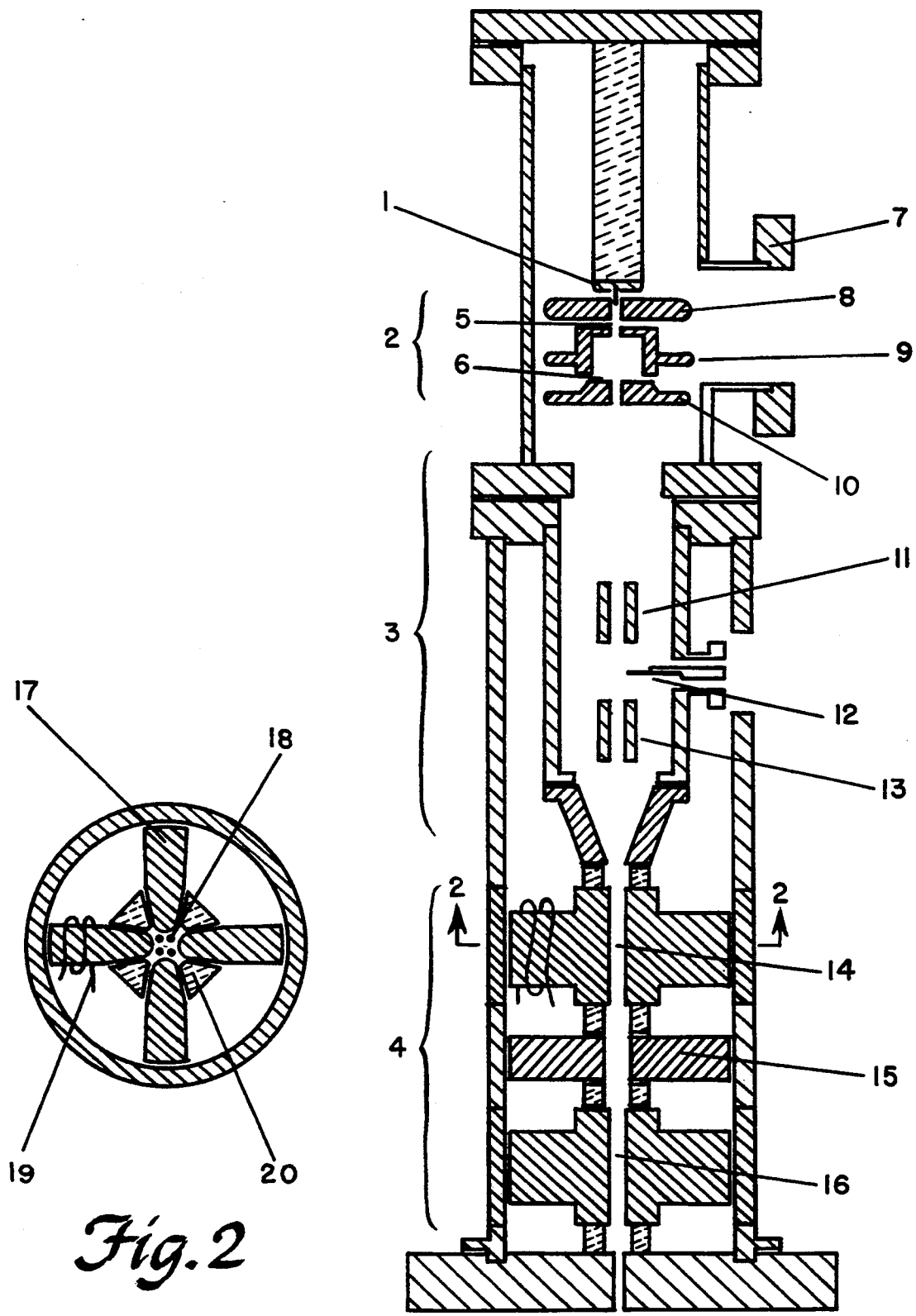
FIG. 1 presents a cross section of an achromatic ion beam column.
FIG. 2 presents a cross section of an interleaved quadrupole lens.

The liquid metal ion source 1 of the ion beam column usually is placed at many kilovolts negative potential with respect to a nearby extracting electrode 8, which typically is a flat surface with a hole drilled through it to allow passage of the ion beam. As is well known in ion and electron optics, this forms an "aperture lens" which has a diverging lens action. An ion pump attached to port 7 is provided to produce $10^{-8}$ Torr vacuum near the ion source.

Beyond the extraction electrode is a condenser lens system 2 which if adjusted properly can converge the ions into a parallel beam. A single condenser lens may be used, but since the extraction of ions proceeds well only over a narrow range of voltages, and the focusing action of the single gap also requires a fixed voltage, the output energy is substantially fixed. Therefore a two-lens condenser system is useful as a means of providing variable ion energy. The electrodes 6, 7, 8 form one such condensing lens system, in which the gaps 5, 6 between the three electrodes form two round electrostatic lenses. The ion source and electrodes are maintained at the required potentials by high voltage power supplies according to means well known in prior art.

Ions leaving the condenser lens 2 pass through a drift space 3 and enter an interleaved quadrupole lens system 4. In the drift space are located multipole deflectors 11, 13 which are capable of deflecting ions in a plane in any azimuth about the beam axis, and an aperture-defining assembly 12 composed of four independent non-interfering vanes, only one of which is shown for clarity.

As shown in FIG. 2, interleaved quadrupole lenses contain 8 poles with centers equally spaced in azimuth about the beam direction. The poles are alternately magnetic poles 17 and electric poles 18, thereby forming an electric quadrupole lens and a magnetic quadrupole lens. The 45 degrees spacing of the poles causes the quadrupole force fields of the two lenses to have coincident principal sections, while the location of the centers in a single plane causes the lenses to have coincident principal planes.

In the preferred embodiment the poles 17, made of ferromagnetic material with windings 19 around them, are rigidly bonded to ceramic spacers 20, which in turn serve to support diamagnetic electrodes 18. The structure thus forms two non-interfering, nested quadrupoles, both of which can have the wide pole-tip radius required to achieve a nearly perfect quadrupole field. Squirrel-cage structures have narrower pole tips and necessarily introduce unwanted multipole field components when they are excited with a quadrupole voltage.

Interleaved lenses can be utilized to form a single quadrupole force field with an adjustable ratio of electric force to magnetic force. The force ratio R is determined by measuring electrode voltages and winding currents, and by formulas relating magnetic field strength and electric field strength to such measurements, according to means well known in the prior art.

When the electric force is adjusted to have half the magnitude of the magnetic force and opposite in direction, so that $R = -0.5$, the interleaved lens becomes achromatic to first degree in E. This means that it will image a point object into a spot with a width in one principal section of the form $$d = C_1 a\, dE/E + C_2 a (dE/E)^2$$

where $C_1 = 0$.

If the electric force is further increased, but not to a magnitude larger than the magnetic force, the interleaved lens becomes a chromatic compensating lens with a negative value of $C_1$ (V. M. Kelman and S. Ya. Yavor, Zuhrnal Tekhnicheskoi Fiziki 33 (1963) 368). For other force ratios it acts as a normal lens with a positive value of $C_1$.

The simplest lens arrangement which can focus in both principal sections is a doublet system. The upstream interleaved lens 14 and downstream interleaved lens 16 compose such a doublet. Spacer 15 serves to adjust the separation of the lenses. A system consisting of two lenses always has a single axis defined by the center of the two lenses, and requires only angular adjustment of the doublet as a whole relative to the input beam in order to function correctly. The doublet has a magnification which differs in its two principal sections, and therefore functions to produce a focused beam which has two different widths, both of which are small.

Figure 3:
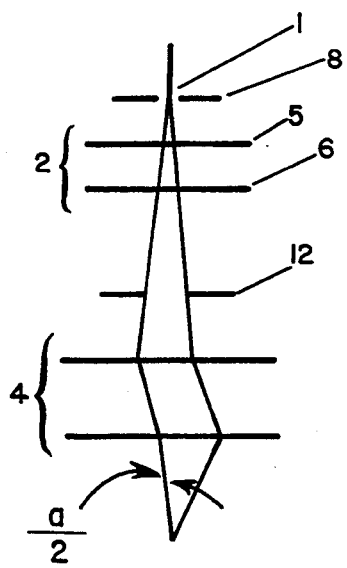
FIG. 3 presents an achromatic column containing an inactive condensing lens.

As shown in FIG. 3, if all the electrodes of the condenser lens are set to the same voltage, it will have no focusing effect and hence produce no chromatic aberration. The functioning elements consist of the ion source 1 and extraction electrode 8, and the doublet system 4 of interleaved quadrupole lenses. When the interleaved lenses are set at the achromatic operating point, there is no chromatic aberration introduced by the final focusing lens of the optical column. The focal spot is accordingly smaller than a system of similar dimensions consisting of an ion source, extraction electrode, and an electrostatic lens, when the two systems are operated at the same beam width. This width is set by the adjustable aperture 12. The width may be increased so that the column containing the interleaved lenses produces more current than one containing an electrostatic lens, when the focal spots are the same size.

Figure 4:
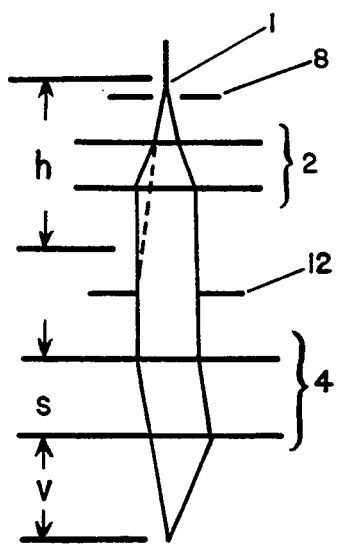
FIG. 4 presents the condensing lens converging the ions into a parallel beam.

As shown in FIG. 4, when the electrodes of the condenser lens are turned on to appropriate voltages, more of the ions from the source may be directed into the interleaved lens 4. Most of the current from an LMIS occurs within a half angle of about 14 degrees. When the distance from the source to the first lens gap is 9 mm, a parallel beam of about 5 mm full width will be formed, providing that the first lens is of sufficiently large diameter.

The increased angles $a_s$ and $b_s$ which are possible cause increased chromatic aberration in the condenser lens. In order to eliminate the positive chromatic aberration, the doublet of interleaved lenses is adjusted to produce an exactly compensating negative chromatic aberration, as determined by insensitivity of spot size to ion energy E at small settings of the angle-defining aperture 12. Such adjustment compensates all sources of positive 1st-order chromatic aberration, including the aperture lens formed by the hole in the acceleration electrode and the accelerating field in the gap between the source and the extractor. The aperture may then be opened to the point where the remaining higher-order aberrations cause the focused beam to reach a specified spot diameter. The current into the focused spot is thereby increased relative to a system which does not include an interleaved quadrupole lens system for cancelling chromatic aberration.

It is not immediately obvious that interleaved lenses, which have two independent principal sections, can be adjusted to compensate the chromatic aberration of a round lens. A single interleaved lens cannot, since it introduces aberrations of opposite sign in the two principal sections. However two interleaved lenses introduce two variables, and the simultaneous linear equations for the aberrations in the two principal sections can be solved, given the dimensions of the system. For the parallel-beam geometry of FIG. 4, the coefficients $C_x$, $C_y$ of the two interleaved lenses must satisfy $$C_x/f_x^2 = C_y/f_y^2 = -C/h^2$$

where $f_x$, $f_y$, are the focal lengths of the doublet 4, and h, C are the focal length and chromatic aberration coefficient of the round lens 2. In a thin-lens approximation, the coefficients $C_{yu}$, $C_{xd}$ in the converging principal sections of the individual upstream and downstream lenses of the doublet are given by $$C_{yu}/f_u = -(1 + 2s/v)v\, C/2h^2,$$

$$C_{xd}/f_d = -v\, C/2h^2,$$

where v is the image distance of the downstream lens, the coefficients of the diverging sections are given by $$C_{xu} = -C_{yu},$$

$$C_{yd} = -C_{xd},$$

and s is the separation of the lenses. Different expressions apply when the beam is not parallel. The thin-lens coefficients are themselves of the form $$C_{yu}/f_u = (2R_u + 1)/(2R_u + 2)$$

$$C_{xd}/f_d = (2R_d + 1)/(2R_d + 2)$$

so that the electric-to magnetic force ratios $R_u$, $R_d$ can be calculated given the interleaved lens dimensions s,v and the condensing lens parameters C, h. In the best mode of operation, a power supply of the type found in the prior art is used, in which the electric and magnetic portions of the interleaved lens are varied in proportion, thereby varying f at fixed R. $R_u$ and $R_d$ are set at values calculated for the C,h of the lens which is to be compensated. Focus is then obtained by varying $f_u$, $f_d$ for the two lenses of the quadrupole doublet, according to procedure well known in the prior art.

Measurement of submicron beam size may be accomplished by using deflectors 11, 13 or a deflector downstream of lens 4. Width can be determined from the deflection required to sweep the focused beam across a knife edge. A method which avoids destruction of the edge by ion-beam sputtering is to measure the electrical charge required to micromachine away a raster-swept region of a thin specimen, when the distance between lines in the raster is smaller than the beam width. A third method of the prior art which does not require submicron test specimens is to measure d as a function of a. When a single ray is produced by making aperture 12 small, equal and opposite settings of deflectors 11 and 13 cause the ray to enter the aperture of the interleaved lens far off its axis and accordingly to have large values of a. When the interleaved lens is improperly adjusted, large and easily measured aberrations d are caused. The magnetic-to-electric ratio in the interleaved lens is then adjusted to produce minimum aberration of the ray, rather than minimum spot size.

Systems consisting of a plurality of interleaved lenses can be designed so that the magnification is equal in the two principal sections. The simplest such system is the triplet [L. R. Harriott, W. L. Brown, and D. L. Barr, J. Vac. Sci. Tech. B8 (1990) 1706]. Triplets suffer the disadvantages of extra complexity of operation and of considerable high-precision mechanical fabrication, which is necessary in order to assure that the centers of the three lenses lie on a straight line.

Figure 5:
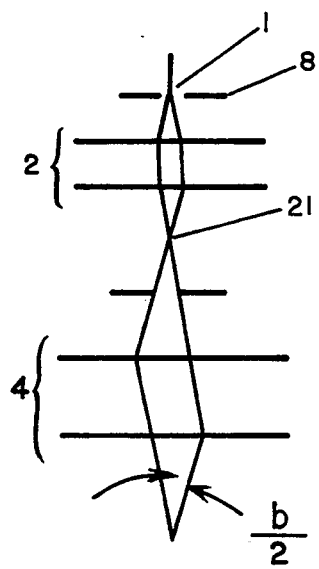
FIG. 5 presents the condensing lens converging the ions into a crossover.

It is not necessary to operate the column with a parallel beam. The condenser lens in general forms an intermediate image of the ion source, which may lie at any position along the axis of the column, including upstream of the ion source or downstream of the final image plane. The column thus forms a so-called zoom lens, in which the minimum size of the image (as determined from the magnification alone without accounting for aberrations) varies as the position of the intermediate image is changed. As shown in FIG. 5, the intermediate image 21 may be located between the condenser lens and the next lens, in which case the beam is said to cross over, since rays from the periphery of the beam cross the system axis.

Figure 6:
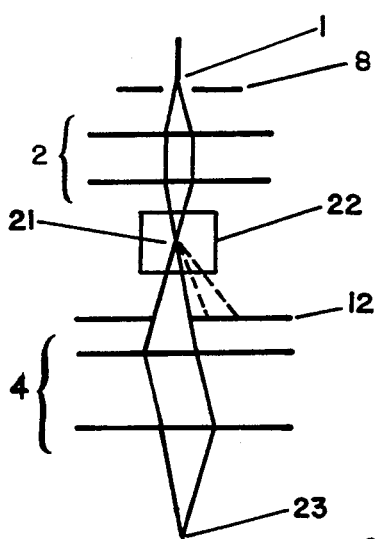
FIG. 6 shows a mass-separating achromatic ion beam column.

Ion sources of the liquid alloy type produce several kinds of ions at once and require mass analysis in order to produce a focused beam of a single kind of ion. A Wien velocity filter 22 placed between the condenser lens and the next downstream lens as shown in FIG. 6 deflects unwanted ion species off the beam axis, allowing only ions with a given charge-to-mass ratio to proceed undeflected. Although such deflection occurs for intermediate images at any position, producing divergent, parallel, or convergent beams emerging from the condenser lens, the best operation of the column occurs when the crossover 21 occurs in the center of the Wien filter 22, so that chromatic aberrations introduced by the filter are eliminated.

Ions which are deflected enough so that they cannot pass through the aperture of the interleaved lens are completely eliminated from the image which it forms. Although such systems may not separate the closely spaced isotopes of a given element, such as gallium (mass 69,71), they are useful for separating the widely spaced kinds of ions produced by alloy-based ion sources. For example the alloy $Ni_4B_6$ produces $Ni^{+2}$ (charge-to-mass 30, 32% yield) and the commercially important $B^{+1}$ (charge-to-mass 10 or 11, 33% yield). The system comprising an electrostatic condenser lens and an interleaved quadrupole doublet therefore is useful in forming a final image 23 from ions of a single atomic number for such purposes as microfabrication and ion implantation.

Figure 7:
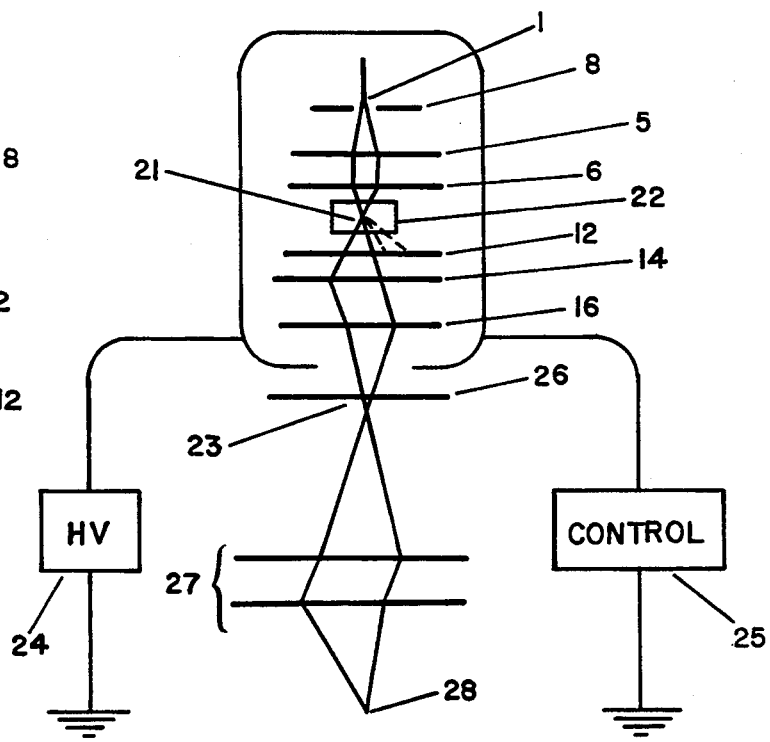
FIG. 7 shows a mass-separating achromatic system for forming finely focused beams at higher energies than are feasible with a two-lens column.

Mass analysis generally must be performed at low E, because the combination of massive ions and high energies requires magnetic fields greater than can be provided by air-cooled electromagnets. If mass analysis at high energy is performed, dipole bending magnets which curve the beam in a large radius of curvature are required [Martin U.S. Pat. No. 4,555,666]. However ion implantation in semiconductors requires energies of 300 kV or higher in order to dope regions which are fractions of a micron deep. As shown in FIG. 7, a high voltage source 24, control electronics 25, and an accelerating gap 26 function to increase the beam energy, while an objective lens 27 focuses the ions into a high-energy final image 28.

When the second intermediate image 23 is placed at the accelerating gap as shown in FIG. 7, aberrations introduced by the gap are minimized. The objective lens 27 is any type of lens, including round electrostatic or magnetic lenses, electric, magnetic, or interleaved quadrupoles. The electric-to-magnetic ratio of the system 4 of interleaved quadrupoles 14, 16 is adjusted to produce minimum spot size at small angles a,b in the plurality of lenses, thereby using its negative chromatic aberration to compensate the positive chromatic aberration of all the other ion-optical components. When chromatic aberration is thereby minimized, the angle-setting apertures may be opened until higher-order aberrations increase spot size. The column comprising ion source 1, condensing lens 2, interleaved quadrupole system 4, accelerating gap 26, and objective lens 27 thereby functions to produce increased ion current in a final focused spot of a given size.

The most useful arrangement comprises an interleaved quadrupole lens system 4 at low energy, because the electric and magnetic forces are oppositely directed in such a lens, thereby requiring higher fields than a simpler lens to reach the same focusing power. This difficulty is lessened if an interleaved lens is operated with particles of low energy or it has a small bore. A useful system is obtained if the objective lens 27 is a magnetic quadrupole doublet, while the second lens 4 is an interleaved lens operating to produce negative chromatic aberration. In this system the objective lens can be utilized to counteract the unequal magnifications introduced by the second lens, thereby making the magnification of the system equal in its two principal sections. Another useful system is obtained if the second lens 4 is a large electrostatic lens, and the objective lens 27 is an interleaved system of small bore and short focal length operated to produce negative chromatic aberration. The essential feature of these particle-beam columns is provision of a plurality of interleaved quadrupole lenses which taken together have negative chromatic aberration and function to compensate the positive chromatic aberration of all other ion-optical components in the column.

I wish to claim:

1. An particle-optical column comprising a needle-type particle source, an extraction electrode, a condensing lens, and an interleaved quadrupole lens system for forming a finely focused particle beam, in which the interleaved lenses are operated at the critical ratio of electric to magnetic fields, such that the negative chromatic aberration of the interleaved lenses cancels the positive chromatic aberration of all other particle-optical components, and the spot diameter is substantially independent of small changes in the particle energy.

2. A particle-optical column as in claim 1 further comprising a Wien velocity filter located between the ion source and the interleaved quadrupole lenses, which serves to produce the finely focused beam of particles of a single mass.

3. A particle-optical column as in claim 2 further comprising rays which cross over within the Wien filter, thereby reducing aberrations relative to the column in which a wide beam passes through the Wien filter.

4. A particle-optical column comprising a needle-type particle source, an extraction electrode, and a plurality of interleaved quadrupole lenses for forming a finely focused particle beam, in which the interleaved lenses are operated at the critical ratio of electric to magnetic fields, such that they add no chromatic aberration to the positive chromatic aberration produced by the needle-type particle source and extraction electrode, and the dependence of spot diameter upon energy is reduced in comparison to the column employing only electrostatic lenses to form the fine beam.

5. A particle-optical column as in claim 4 further comprising a Wien velocity filter located between the ion source and the interleaved quadrupole lenses, which serves to produce the finely focused beam of particles of a single mass.

6. A particle-optical column as in claim 5 further comprising rays which cross over within the Wien filter, thereby reducing aberrations relative to the column in which a wide beam passes through the Wien filter.

7. An particle-optical column comprising a needle-type particle source and a plurality of lenses for forming a finely focused particle beam, and further comprising an interleaved quadrupole lens system which is operated at the critical ratio of electric to magnetic fields such that the negative chromatic aberration of the interleaved lenses exactly cancels the positive chromatic aberration of all other particle-optical components, and the spot diameter is substantially independent of small changes in the particle energy.

* * * * *